United States Patent
Yamamoto

(10) Patent No.: US 10,962,496 B2
(45) Date of Patent: Mar. 30, 2021

(54) METHODS AND APPARATUS FOR WATER DETECTION USING A CAPACITIVE SENSOR

(71) Applicant: SEMICONDUCTOR COMPONENTS INDUSTRIES, LLC, Phoenix, AZ (US)

(72) Inventor: Yasunori Yamamoto, Ora-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 27 days.

(21) Appl. No.: 16/455,369

(22) Filed: Jun. 27, 2019

(65) Prior Publication Data

US 2020/0378915 A1    Dec. 3, 2020

Related U.S. Application Data

(60) Provisional application No. 62/854,447, filed on May 30, 2019.

(51) Int. Cl.
*G01N 27/22* (2006.01)
*H03K 17/96* (2006.01)
*B60R 25/20* (2013.01)

(52) U.S. Cl.
CPC ......... *G01N 27/223* (2013.01); *G01N 27/226* (2013.01); *B60R 25/20* (2013.01); *H03K 17/962* (2013.01)

(58) Field of Classification Search
CPC .. G01N 27/223; G01N 27/226; H03K 17/962; B60R 25/20
USPC ................................................ 324/664
See application file for complete search history.

(56) References Cited

U.S. PATENT DOCUMENTS

| | | | | |
|---|---|---|---|---|
| 3,635,082 A | * | 1/1972 | Prellwitz | G01F 1/712 73/861.04 |
| 3,653,082 A | * | 4/1972 | Davis | A47C 27/06 5/269 |
| 2010/0187838 A1 | * | 7/2010 | Ieda | E05B 85/16 292/336.3 |
| 2010/0264940 A1 | * | 10/2010 | Tsuchida | E05B 81/76 324/679 |
| 2012/0133159 A1 | | 5/2012 | Tateishi et al. | |
| 2014/0000167 A1 | * | 1/2014 | Patel | E05B 85/103 49/32 |
| 2014/0002405 A1 | * | 1/2014 | Salter | H03K 17/962 345/174 |
| 2016/0138307 A1 | * | 5/2016 | Pohl | E05B 17/10 292/336.3 |
| 2016/0222703 A1 | * | 8/2016 | Koizumi | E05B 85/16 |
| 2017/0030119 A1 | * | 2/2017 | Usui | E05B 85/10 |
| 2018/0283843 A1 | | 10/2018 | Adams et al. | |

* cited by examiner

*Primary Examiner* — Christopher P McAndrew
(74) *Attorney, Agent, or Firm* — The Noblitt Group, PLLC; Hettie L. Haines

(57) ABSTRACT

Various embodiments of the present technology may provide methods and apparatus for water detection using a capacitive sensor. A door handle apparatus may include a first sensor and a second sensor positioned to detect water flowing across the sensors. Each sensor may comprise a first electrode, a second electrode, wherein each sensor operates independently.

19 Claims, 8 Drawing Sheets

METHODS AND APPARATUS FOR WATER DETECTION USING A CAPACITIVE SENSOR

CROSS-REFERENCE TO RELATED APPLICATIONS

This application claims the benefit of U.S. Provisional Patent Application No. 62/854,447, filed on May 30, 2019, the entire contents of which is incorporated herein by reference.

BACKGROUND OF THE TECHNOLOGY

Capacitive sensors operate by detecting changes in the capacitance formed between two electrodes, commonly referred to as a transmission electrode and a sense electrode. A sensing circuit can recognize an object based on changes in the capacitance and may be configured to determine the location, pressure, direction, speed, and acceleration of the object as it is approaches and/or contacts the capacitive sensor.

Various applications for the capacitive sensor may include mechanisms that are used outdoors and/or are very likely to come in contact with water. For example, in one application, the capacitive sensor may be integrated into an exterior door handle on a vehicle and may be used as a touch sensor to operate various mechanisms in the vehicle. For example, when a person touches the sensor with their hand or finger, the contact with the sensor may activate the door locks. However, in conventional systems and in cases where it is raining, water flow from the rain alone may activate the door locks.

SUMMARY OF THE INVENTION

Various embodiments of the present technology may provide methods and apparatus for water detection using a capacitive sensor. A door handle apparatus may include a first sensor and a second sensor positioned to detect water flowing across the sensors. Each sensor may comprise a first electrode, a second electrode, wherein each sensor operates independently.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and circuit diagrams. Such functional blocks and circuit diagrams may be realized by any number of components configured to perform the specified functions and achieve the various results. For example, the present technology may employ various types of sensing circuitry, amplifiers, signal converters, microcontrollers, logic circuits, power sources, and the like, which may carry out a variety of functions. The methods and apparatus for a capacitive sensor according to various aspects of the present technology may operate in conjunction with any suitable device and/or system that may encounter water, such as an exterior door handle on a vehicle, touch sensor systems for use outdoors, touch sensor systems for use near a swimming pool or spa, touch sensor systems for use in a shower or bath, and the like.

Figure 1:
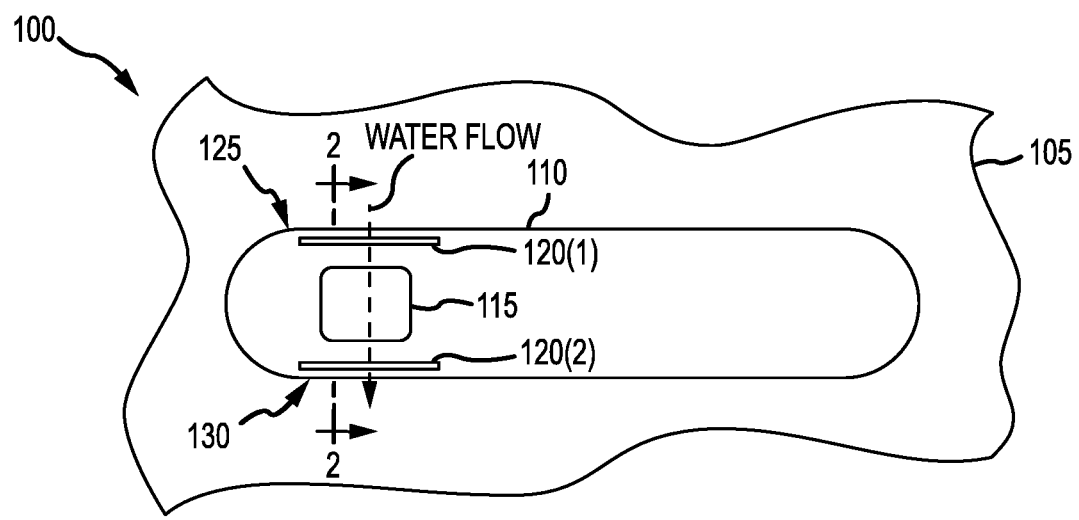
FIG. 1 representatively illustrates an exterior door handle of a vehicle featuring a capacitive sensor in accordance with an exemplary embodiment of the present technology.
Figure 2:
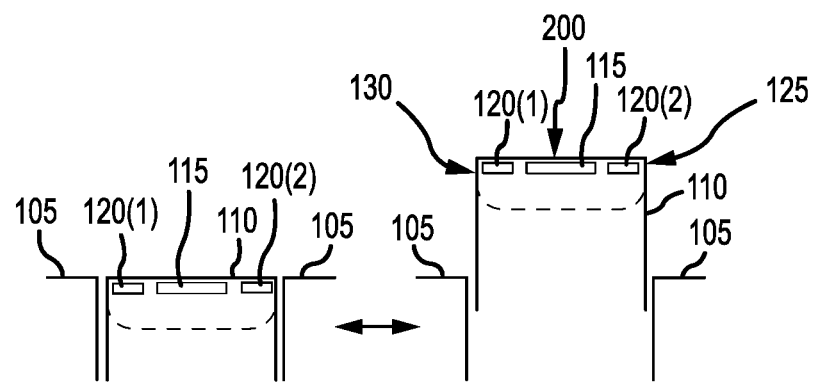
FIG. 2 representatively illustrates a cross-sectional view of the door handle of FIG. 1 in a first state and a second state and in accordance with an exemplary embodiment of the present technology.
Figure 10:
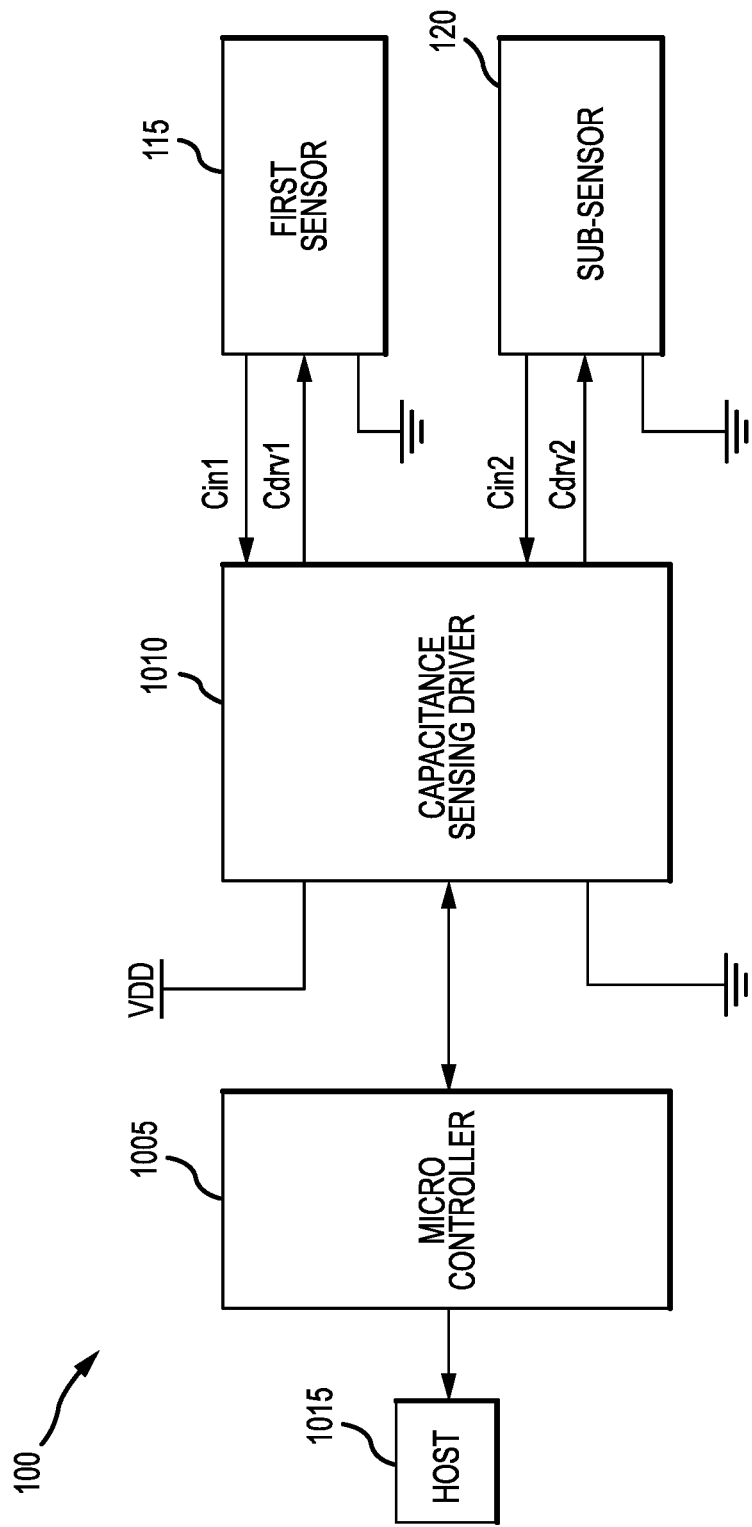
FIG. 10 representatively illustrates a block diagram of a sensor system in accordance with an exemplary embodiment of the present technology.

Referring to FIGS. 1, 2, and 10, in various embodiments of the present technology, a sensor system 100 may be configured to sense or otherwise detect water flowing across a sensing portion of the sensor system 100. In addition, the sensor system 100 may be configured to detect a touch event, such as a touch from a human finger. According to an exemplary application, the sensor system 100 may be integrated in a vehicle 105. In particular, the sensor system 100 may be integrated within an exterior door handle 110 of the vehicle 105.

According to various embodiments, the door handle 110 may comprise a pop-out door handle that is flush with an exterior panel of the vehicle 105 in a first position and extends from the exterior panel of the vehicle 105 in a second position. In alternative embodiment, the door handle 110 may comprise a conventional door handle that maintains a fixed position which extends from the exterior panel of the vehicle 105. According to various embodiments, the door handle 110 may comprise any size and shape suitable for opening and closing a door on the vehicle 105.

In various embodiments, the sensor system 100 may comprise a first sensor 115, a sub-sensor 120, a capacitance sensing driver circuit 1010, and a microcontroller 1005 that operate together to measure a capacitance for each of the first sensor 115 and sub-sensor 120, perform signal processing, determine whether the changes in the first sensor 115 and the sub-sensor 120 give rise to an actionable event, determine whether capacitance of each of the first sensor 115 and the sub-sensor 120 indicate water on the sensors 115, 120, and generate a control signal to indicate the actionable event. In various embodiments, the first sensor 115 and the sub-sensor 120 may be positioned adjacent to each other and operate independently from each other.

Figure 8:
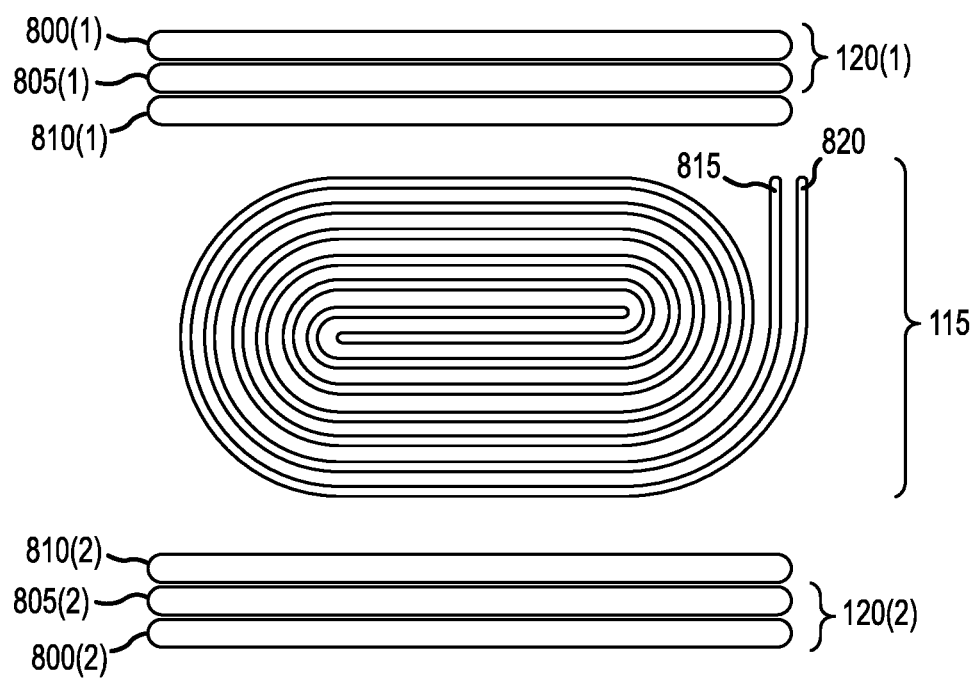
FIG. 8 representatively illustrates electrode layouts for a first capacitive sensor and a second capacitive sensor in accordance with various embodiments of the present technology.
Figure 9:
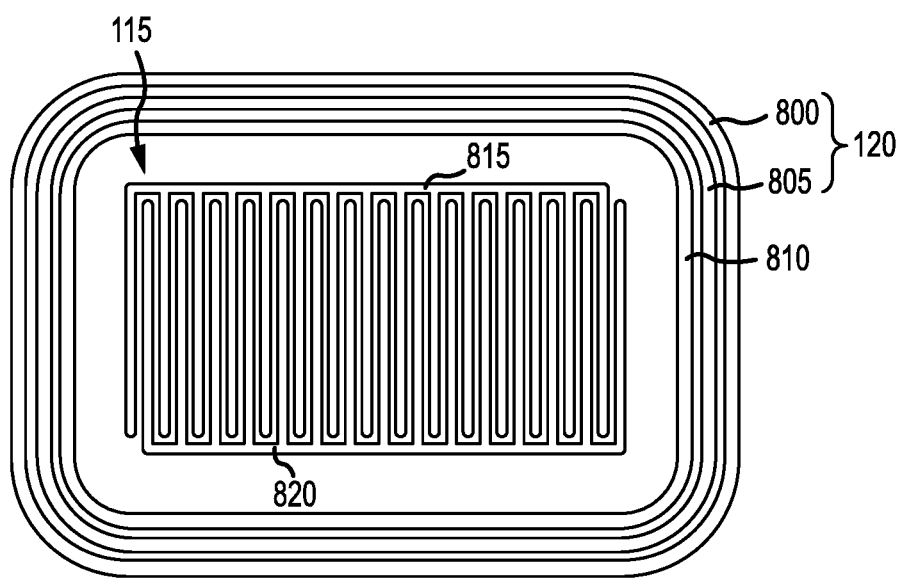
FIG. 9 representatively illustrates electrode layouts for a first capacitive sensor and a second capacitive sensor in accordance with various embodiments of the present technology.

In various embodiments, and referring to FIGS. 8-10, the first sensor 115 may be configured to generate a first electric field (not shown) and a corresponding first input signal Cin1 that represents a capacitance of the first sensor 115. In various embodiments, the first sensor 115 may be configured as a mutual capacitance sensor. For example, the first sensor 115 may comprise a first electrode 815 in communication with a second electrode 820, wherein the first and second electrodes 815, 820 may be configured to form a first capacitor and generate the first electric field.

In various embodiments, one electrode, such as the first electrode 815, may be connected to a first drive signal Cdrv1 and operate as a transmission electrode (i.e., a drive electrode) and the remaining electrode, such as the second electrode 820, may operate as a reception electrode (i.e., an input electrode), or vice versa.

In various embodiments, each of the first and second electrodes 815, 820 may comprise a single, continuous conductive element or a plurality of conductive elements having the same polarity (and referred to collectively as an electrode). In addition, each electrode may be formed using any suitable metal and/or other conductive material.

Similarly, the sub-sensor 120 may be configured to generate a second electric field (not shown) and a corresponding second input signal Cin2 that represents a capacitance of the sub-sensor 120. In various embodiments, the sub-sensor 120 may be configured as a mutual capacitance sensor.

In various embodiments, the sub-sensor 120 may comprise a third electrode 800 and a fourth electrode 805 in communication with each other. For example, the third and fourth electrodes 800, 805 may be configured to form a second capacitor and generate the second electric field. In an exemplary embodiment, one electrode, such as the third electrode 800, may be connected to a second drive signal Cdrv2 and operate as a transmission electrode (i.e., a drive electrode) and the remaining electrode, such as the fourth electrode 805, may operate as a reception electrode (i.e., an input electrode), or vice versa.

Figure 3:
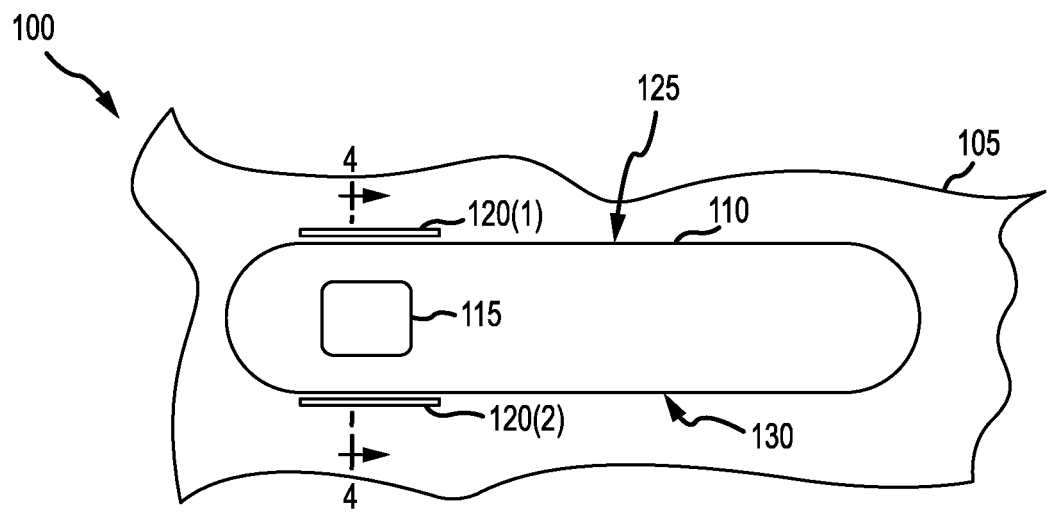
FIG. 3 representatively illustrates an exterior door handle of a vehicle featuring a capacitive sensor in accordance with an alternative embodiment of the present technology.
Figure 4:
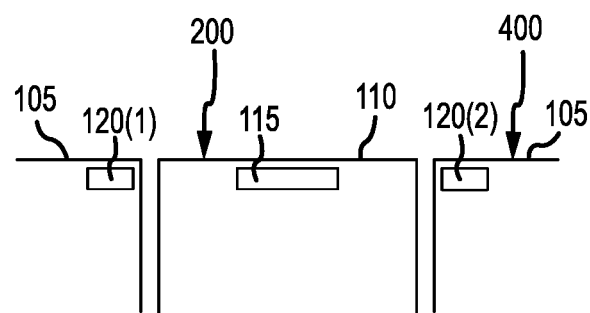
FIG. 4 representatively illustrates a cross-sectional view of the door handle of FIG. 3 in the first state and in accordance with an exemplary embodiment of the present technology.

Referring to FIGS. 1-9, the sub-sensor 120 and/or the third and fourth electrodes 800, 805 may be formed on or within a same substrate as the first sensor 115, or alternatively on or within a different substrate from the first sensor 115. For example, the first sensor 115 and the sub-sensor 120 may be formed within the door handle 110 (e.g., as illustrated in FIGS. 1, 2, and 5-7). However in alternative embodiments, the first sensor 110 may be formed within the door handle 110, while the sub-sensor 120 may be formed within an exterior panel of the vehicle 105 (e.g., as illustrated in FIGS. 3 and 4).

In various embodiments, each of the third and fourth electrodes 800, 805 may comprise a single, continuous conductive element. Alternatively, the third and fourth electrodes 800, 805 may comprise a plurality of conductive elements having the same polarity (and referred to collectively as an electrode). In various embodiments, each electrode 800, 805 may be formed using any suitable metal and/or other conductive material, such as indium tin oxide.

The sensor system 100 may comprise any number of sub-sensors 120. For example, the sensor system 100 may comprise a first sub-sensor 120(1) and a second sub-sensor 120(2). In the present case, each sub-sensor 120(1), 120(2) may comprise two electrodes (i.e., a drive electrode and a reception electrode) capable of forming an electric field.

In various embodiments, the sensor system 110 may further comprise a separator electrode 810 arranged between the first sensor 115 and the sub-sensor 120. The separator electrode 810 may have a ground potential (i.e., zero volts). In alternative embodiments, the separator electrode 810 may have a potential greater than zero volts but less than the supply voltage $V_{DD}$. For example, the separator electrode 810 may have a potential of 0.1V, 3.3V, $½V_{DD}$, or any other suitable voltage potential.

The first sensor 115 and the sub-sensor 120 may be arranged in any suitable pattern. For example, the first sensor 115 may be positioned between a top edge 125 of the pop-out door handle and a bottom edge 130 of the pop-out door handle (e.g., as illustrated in FIGS. 1, 3, 5, 6 and 7).

Figure 5:
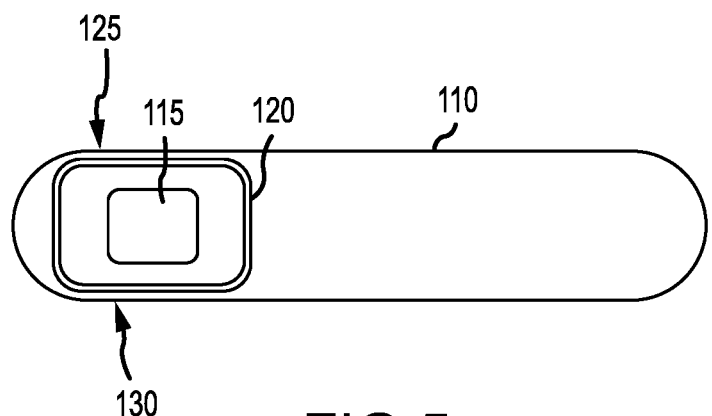
FIG. 5 representatively illustrates an exterior door handle of a vehicle featuring a capacitive sensor in accordance with an alternative embodiment of the present technology.
Figure 6:
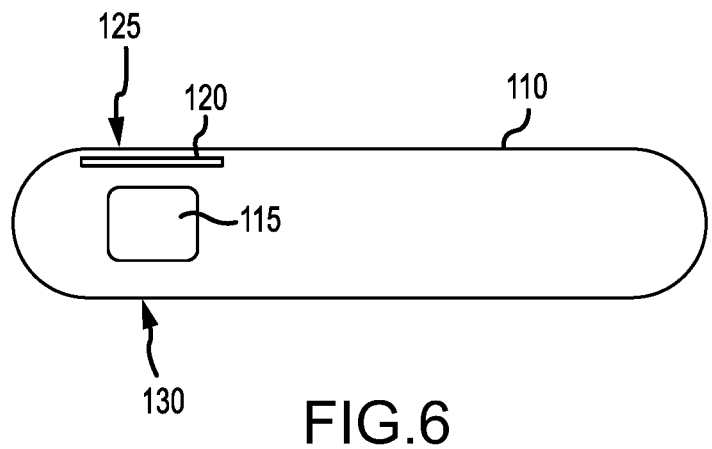
FIG. 6 representatively illustrates an exterior door handle of a vehicle featuring a capacitive sensor in accordance with an alternative embodiment of the present technology.
Figure 7:
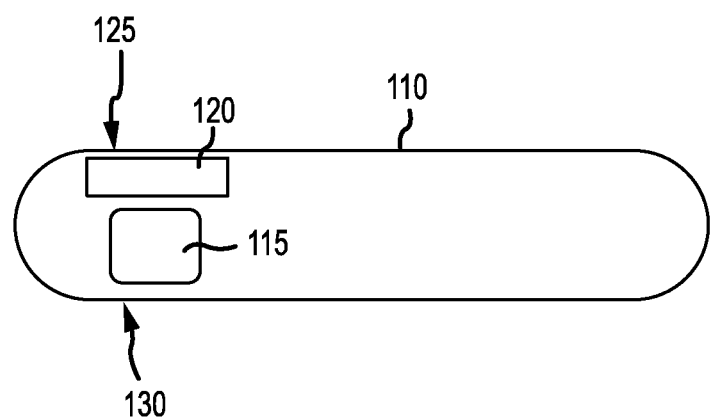
FIG. 7 representatively illustrates an exterior door handle of a vehicle featuring a capacitive sensor in accordance with an alternative embodiment of the present technology.

The sub-sensor 120 may be arranged directly adjacent to the first sensor 115. For example, in one embodiment, the sub-sensor 120 may be arranged above the first sensor 115 (e.g., as illustrated in FIGS. 6 and 7). Additionally, in a case where the sensor system 100 comprises multiple sub-sensors 120, the first sub-sensor 120(1) may be positioned above the first sensor 115 and the second sub-sensor 120(2) may be positioned below the first sensor 115 (e.g., as illustrated in FIGS. 1 and 3). In an alternative embodiment, the sub-sensor 120 may surround the first sensor 115 (e.g., as illustrated in FIGS. 5 and 9).

In various embodiments, the first sensor 115 and the sub-sensor 120 may be integrated within an apparatus (i.e., embedded within the apparatus) and/or covered with a water-resistant or water-proof cover. For example, and referring to FIGS. 2 and 4, in the case of a door handle application, the first sensor 115 and the sub-sensor 120 may be embedded within the door handle 110 just below (e.g., 2-3 millimeters) an outer surface 200 of the door handle 110 and/or an outer surface 400 of the vehicle 105, wherein the outer surfaces 200, 400 are impervious to water. In other applications, a cover, comprising a plastic or other suitable water-resistant or water-proof material, may be disposed on a sensing surface of the sensors 115, 120 to prevent water and other debris from corroding the sensors 115, 120 or otherwise impairing the electric fields.

Referring to FIGS. 8 and 9, the first, second, third and fourth electrodes 815, 820, 800, 805 may be arranged in any suitable pattern and may comprise any shape and size. For example, in one embodiment, the first and second electrodes 815, 820 may be equally spaced relative to each other and/or arranged parallel to each other and in a spiral shape. In an alternative embodiment, each of the first and second electrodes 815, 820 may comprise a comb-shape, wherein the comb-shapes are interleaved with each other.

In one embodiment, the third and fourth electrodes 800, 805 may be parallel to each other. In an alternative embodiment, the third and fourth electrodes 800, 805 may be equally spaced relative to each other and arranged to surround the first and second electrodes 815, 820 (i.e., the first sensor 115), such as a ring shape, a square shape, or any other continuous shape.

The separator electrode 810 may be arranged between the first sensor 115 and the sub-sensor 120 and may comprise any shape and size. For example, in one embodiment, the separator electrode 810 may be arranged in parallel with the third and fourth electrodes 800, 805 and comprise a same shape as the third and fourth electrodes 800, 805. However, in alternative embodiments, the separator electrode 810 may comprise a different shape from the first, second, third, and fourth electrodes 815, 820, 800, 805.

Referring again to FIG. 10, the capacitance sensing driver circuit 1010 may be configured to measure and/or detect changes in the capacitance of the first sensor 115 and the sub-sensor 120 via changes in the first and second electric fields. For example, the capacitance sensing driver circuit 1010 may be coupled to the first sensor 115 and the sub-sensor 120 and may be configured to receive the first and second input signals Cin1, Cin2. The capacitance sensing driver circuit 1010 may comprise any suitable circuit and/or system for sensing, detecting, or otherwise measuring changes in capacitance.

In addition, the capacitance sensing driver 1010 may be configured to generate a drive signal, such as the first drive signal Cdrv1 and the second drive signal Cdrv2. For example, the capacitance sensing driver circuit 1010 may be connected to the supply voltage $V_{DD}$ and generate the drive signals Cdrv1, Cdrv2 according to the supply voltage $V_{DD}$.

The capacitance sensing driver circuit 1010 may be configured to perform various processing functions, such as converting an input signal into a voltage value, amplification, signal conversion, and the like. For example, the capacitance sensing driver circuit 1010 may comprise an amplifier (not shown), a signal converter (not shown), such as an ADC (analog-to-digital) and/or a DAC (digital-to-analog) for signal conversion, and the like. In various embodiments, the amplifier may be configured to convert each of the first input signal Cin1 (representing a first capacitance value) and the second input signal Cin1 (representing a second capacitance value) to a voltage and/or apply a gain the voltage. For example, the amplifier may comprise a differential amplifier for generating a voltage difference value. The amplifier may also be configured to amplify a signal by applying a gain to the voltage difference and generate an output voltage according to the voltage difference and/or the applied gain. The ADC may be connected to an output terminal of the amplifier and configured to convert the output voltage to a digital value. The capacitance sensing driver circuit 1010 may transmit the capacitance information, such as in the form of a digital value, to the microcontroller 1005.

The microcontroller 1005 may be connected to the capacitance sensing driver circuit 1010 and may transmit signals to and/or receive signals from the capacitance sensing driver circuit 1010. For example, the microcontroller 1005 may receive the capacitance data (e.g., a digital value) from the capacitance sensing driver circuit 1010.

According to various embodiments, the microcontroller 1005 may be configured to perform various control functions, logic functions, and the like. In addition, the microcontroller 1005 may be configured to perform various computations, such as addition, subtraction, multiplication, and the like. The microcontroller 1005 may comprise various logic gates and/or other circuitry to perform the desired computations, control functions, and/or logic functions.

The microcontroller 1005 may receive the capacitance data (e.g., a digital value) from the capacitance sensing driver circuit 1010, interpret the data, and perform an appropriate response and/or produce an appropriate output signal according to the capacitance data. For example, the microcontroller 1005 may compare a first digital value (that reflects the first electric field) to a first predetermined threshold value, compare a second digital value (that reflects the second electric field) to a second predetermined threshold value, and determine whether an actionable event occurred based on the comparisons. An indication of an actionable event may occur if the first digital signal is above the first predetermined threshold and the second digital value is above the second predetermined threshold.

Figure 11:
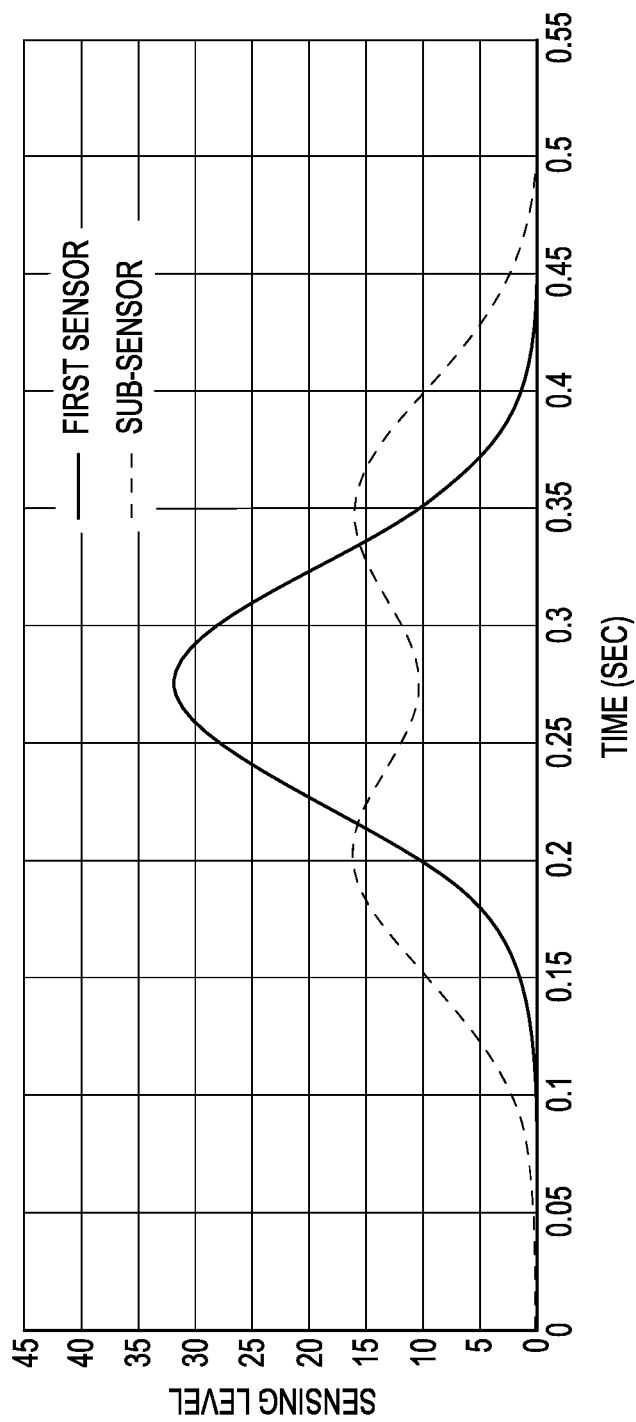
FIG. 11 is a waveform illustrating various sensing levels of the first and second electrodes in accordance with an exemplary embodiment of the present technology.

According to various embodiments, the first sensor 115 and the sub-sensor 120 may be used together to determine if an actionable event has occurred. For example, in the case of a vehicle application and referring to FIG. 11, water flowing across the first and sub-sensors 115, 120 may produce particular sensing levels (e.g., digital values) and/or the sensing levels for each sensor 115, 120 may peak at particular times relative to each other. For example, water flow may be detected if the sensing level for the sub-sensor 120 peaks before and after a peak sensing level of the first sensor 115. In various embodiments, the microcontroller 1005 may interpret this response as a non-actionable event.

However, a peak in the sensing level of the first sensor 115 and little to no change to the sensing level of the sub-sensor 120 may indicate that a user is touching the first sensor 115. The microcontroller 1005 may interpret this response as an actionable event and generate an action signal.

The microcontroller 1005 may also operate in conjunction with a host device 1015 (e.g., the vehicle system). For example, the microcontroller 1005 may transmit the action signal to the host device 1015, wherein the host device 1015 performs a predetermined function based on the action signal, such as unlocking or locking a door lock on the vehicle 105.

The particular implementations shown and described are illustrative of the technology and its best mode and are not intended to otherwise limit the scope of the present technology in any way. Indeed, for the sake of brevity, conventional manufacturing, connection, preparation, and other functional aspects of the system may not be described in detail. Furthermore, the connecting lines shown in the various figures are intended to represent exemplary functional relationships and/or steps between the various elements. Many alternative or additional functional relationships or physical connections may be present in a practical system.

In the foregoing description, the technology has been described with reference to specific exemplary embodiments. Various modifications and changes may be made, however, without departing from the scope of the present technology as set forth. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any appropriate order and are not limited to the explicit order presented in the specific examples. Additionally, the components and/or elements recited in any system embodiment may be combined in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology.

The invention claimed is:

1. A door handle apparatus integrated within a vehicle door, comprising:
   a pop-out door handle comprising a first outer surface that is flush with a second outer surface of the vehicle door;
   a first sensor integrated within the pop-out door handle, wherein the first sensor is directly adjacent to the first outer surface and comprises a first electrode and a second electrode, and wherein the first electrode is capable of forming a first electric field with the second electrode; and
   a second sensor integrated within one of the pop-out door handle and the vehicle door, wherein the second sensor is positioned above the first sensor and comprises a third electrode and a fourth electrode, and wherein the third electrode is capable of forming a second electric field with the fourth electrode.

2. The door handle apparatus according to claim 1, wherein the first sensor is positioned between a top edge of the pop-out door handle and a bottom edge of the pop-out door handle.

3. The door handle apparatus according to claim 1, wherein:
   the second sensor comprises a ring-shape that surrounds the first sensor; and
   the third and fourth electrodes are equally spaced relative to each other.

4. The door handle apparatus according to claim 1, wherein:
   the first electrode comprises a comb-shape;
   the second electrode comprises the comb-shape; and
   the first and second electrodes are interleaved with each other.

5. The door handle apparatus according to claim 1, further comprising a separator electrode positioned between the first sensor and the second sensor and having a reference potential.

6. The door handle apparatus according to claim 1, wherein the first and second electrodes are equally spaced relative to each other and arranged in a spiral shape.

7. The door handle apparatus according to claim 1, further comprising:
   a third sensor integrated within the pop-out door handle, and comprising a fifth electrode and a sixth electrode, wherein the fifth electrode is capable of forming a third electric field with the sixth electrode, and wherein the third sensor is positioned directly below the first sensor.

8. A method for detecting water flow across a sensor system, comprising:
   measuring a first capacitance of a first planar sensor, wherein the first sensor comprises a first electrode and a second electrode, wherein the first electrode forms a first electric field with the second electrode;
   measuring a second capacitance of a second planar sensor, wherein the second sensor comprises a third electrode and a fourth electrode, wherein the third electrode forms a second electric field with the fourth electrode; and wherein the first and second sensors are arranged along a same vertical plane, and the second electrode is positioned above the first electrode;
   detecting a change in the first capacitance;
   detecting a change in the second capacitance; and
   detecting water flowing vertically across the second electrode and the first electrode based on a timing of the change in the first capacitance with respect to a timing of the change in the second capacitance.

9. The method according to claim 8, wherein water flow is detected if the change in the second capacitance occurs earlier in time than the change in the first capacitance.

10. The method according to claim 8, wherein a direction of the water flow is downward.

11. A sensor system integrated within an apparatus having a waterproof outer cover, comprising:
   a first mutual capacitive sensor integrated within the apparatus and positioned directly adjacent to the outer cover, and comprising a first electrode and a second electrode, wherein the first electrode is capable of forming a first electric field with the second electrode;
   a second mutual capacitive sensor integrated within the apparatus and positioned directly adjacent to the outer cover and above the first mutual capacitive sensor, and comprising a third electrode and a fourth electrode, wherein the third electrode is capable of forming a second electric field with the fourth electrode;
   a sensing circuit connected to the first and second mutual capacitive sensors and configured to measure a change in the first and second electric fields; and
   a microcontroller connected to the sensing circuit and configured to generate a control signal according to the measured change in the first and second electric fields.

12. The sensor system according to claim 11, wherein:
   the second mutual capacitive sensor comprises a ring-shape that surrounds the first mutual capacitive sensor; and
   the third and fourth electrodes are equally spaced relative to each other.

13. The sensor system according to claim 11, wherein:
   the first electrode comprises a comb-shape;
   the second electrode comprises the comb-shape; and
   the first and second electrodes are interleaved with each other.

14. The sensor system according to claim 11, further comprising a ground electrode positioned between the first and second mutual capacitive sensors.

15. The sensor system according to claim 11, wherein the first and second electrodes are equally spaced relative to each other and arranged in a spiral shape.

16. The sensor system according to claim 11, further comprising a third sensor integrated within the apparatus, and comprising a fifth electrode and a sixth electrode, wherein the fifth electrode is capable of forming a third electric field with the sixth electrode; and wherein the third sensor is positioned directly adjacent to the outer cover and below the first mutual capacitive sensor.

17. The sensor system according to claim 11, wherein the microcontroller is configured to detect water flowing from the second electrode to the first electrode.

18. The sensor system according to claim 11, wherein the microcontroller is configured to detect water flow based on a timing of the change in the first electric field with respect to a timing of the change in the second electric field.

19. The sensor system according to claim 18, wherein the microcontroller detects water flow if the change in the second electric field occurs earlier in time than the change in the first electric field.

\* \* \* \* \*